United States Patent [19]
Kubota et al.

[11] Patent Number: 5,738,942
[45] Date of Patent: Apr. 14, 1998

[54] SEMICONDUCTOR SILICON WAFER AND PROCESS FOR PRODUCING IT

[75] Inventors: Atsuko Kubota, Yokohama; Masakatu Kojima, Yokosuka; Norihiko Tsuchiya, Setagaya-Ku; Shuichi Samata, Yokohama; Masanori Numano, Yokohama; Yoshihiro Ueno, Yokohama, all of Japan

[73] Assignee: Kabushiki Kaisha Toshiba, Kawasaki, Japan

[21] Appl. No.: 580,926

[22] Filed: Dec. 29, 1995

Related U.S. Application Data

[62] Division of Ser. No. 279,007, Jul. 22, 1994, Pat. No. 5,534,294.

[30] Foreign Application Priority Data

Jul. 22, 1993 [JP] Japan ..................... 5-181602
Jun. 10, 1994 [JP] Japan ..................... 6-128959

[51] Int. Cl.$^6$ ............. B32B 9/00; H01L 23/58; H01L 29/04; H01L 21/306
[52] U.S. Cl. ............. 428/428; 257/635; 257/49; 148/DIG. 60; 148/DIG. 61; 437/12; 427/248.1; 427/255; 427/397.7; 427/402
[58] Field of Search .................. 148/DIG. 60, DIG. 61; 428/428; 257/49, 635; 437/12; 427/255, 248.1, 397.7, 402

[56] References Cited

U.S. PATENT DOCUMENTS

| | | |
|---|---|---|
| 4,053,335 | 10/1977 | Hu . |
| 4,561,171 | 12/1985 | Schlosser . |
| 4,666,532 | 5/1987 | Korb et al. . |
| 5,189,508 | 2/1993 | Tachimori et al. . |

FOREIGN PATENT DOCUMENTS

| | | |
|---|---|---|
| 0 092 540 | 10/1983 | European Pat. Off. . |
| 0 131 717 | 1/1985 | European Pat. Off. . |
| 0 604 234 | 6/1994 | European Pat. Off. . |
| 39 10185 | 10/1989 | Germany . |
| 61-135128 | 6/1986 | Japan . |
| 02-177539 | 12/1988 | Japan . |
| 1-315144 | 12/1989 | Japan . |
| 2-47836 | 2/1990 | Japan . |
| 3-273639 | 12/1991 | Japan . |
| 4 53140 | 2/1992 | Japan . |
| 4 163920 | 6/1992 | Japan . |
| 4 171827 | 6/1992 | Japan . |
| 5 74784 | 3/1993 | Japan . |
| 2 080 780 | 2/1982 | United Kingdom . |

OTHER PUBLICATIONS

Applied Physics Letters, vol. 54, No. 18, pp. 1748–1750, May 1, 1989, Hideki Shirai, et al., "Effect of Back-Surface Polycrystalline Silicon Layer on Oxygen Precipitation in Czochralski Silicon Wafers".

Journal of Applied Physics, vol. 68, No. 3, pp. 1272–1281, Aug. 1, 1990, M. Morita, et al. "Growth of Native Oxide on a Silicon Surface".

Extended Abstracts, vol. 93/1, pp. 1286–1287, Jan. 1, 1993, Samuel Nagalingam, et al., "Threshold Interstitial Oxygen Concentration for Intrinsic Gettering with and Without Polyback in CZ–SI Wafers".

*Primary Examiner*—Patrick Ryan
*Assistant Examiner*—Cathy F. Lam
*Attorney, Agent, or Firm*—Oblon, Spivak, McClelland, Maier & Neustadt, P.C.

[57] ABSTRACT

Provided is a process for producing a semiconductor silicon wafer by which an intrinsic gettering effect can be improved and at the same time the top side can be made free from faults. A silicon ingot is produced and sliced to obtain silicon wafers. Then, a polycrystal silicon depositing film is formed on one side of a silicon wafer, which is subjected to a heat treatment in an inert gas, a reducing gas or a mixture thereof to discharge oxygen from the vicinity of the other side. Alternatively, after discharging oxygen from the silicon wafer by a heat treatment, a polycrystal silicon depositing film may be formed on one side of the silicon wafer.

8 Claims, 14 Drawing Sheets

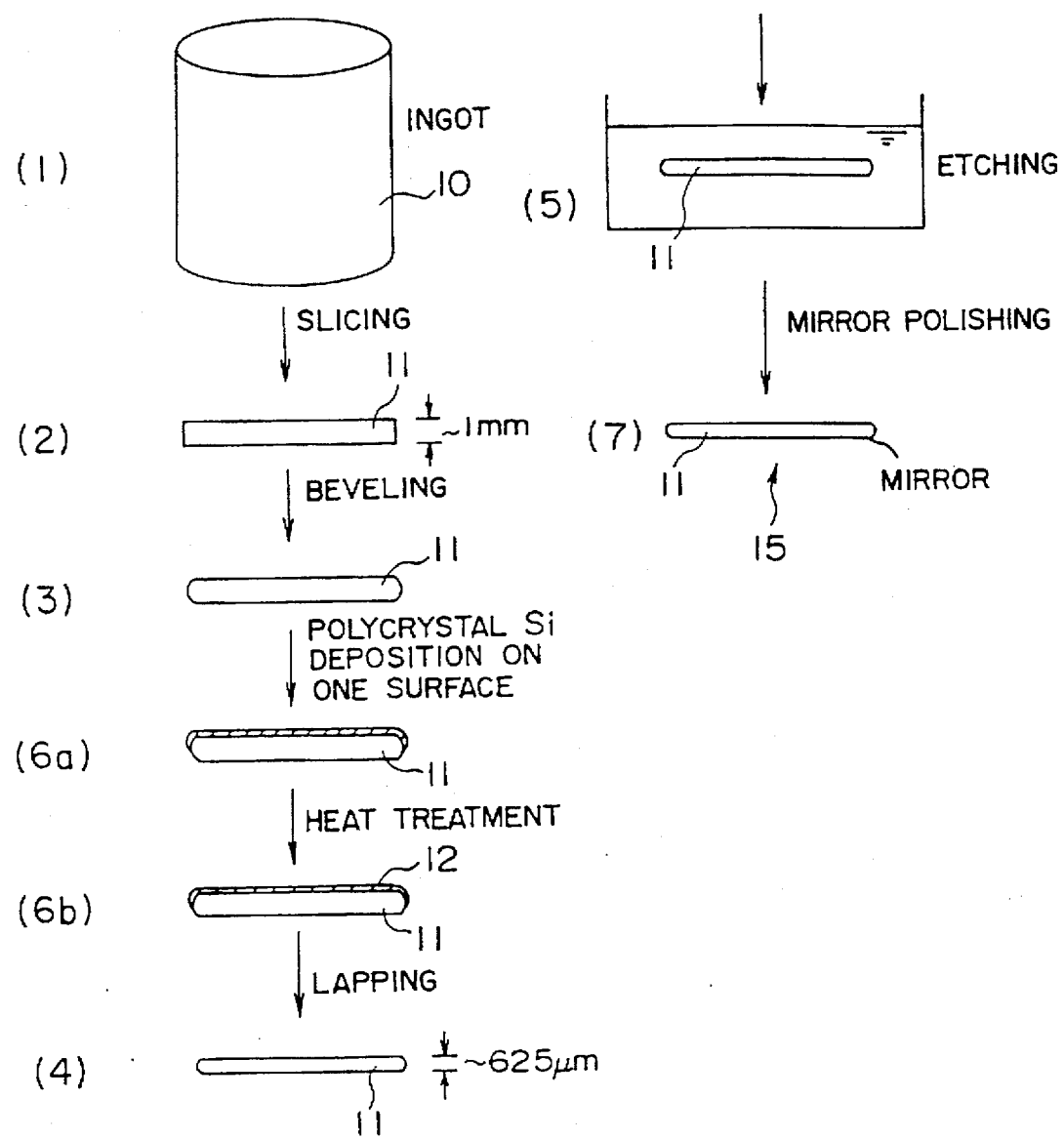
F I G. 10

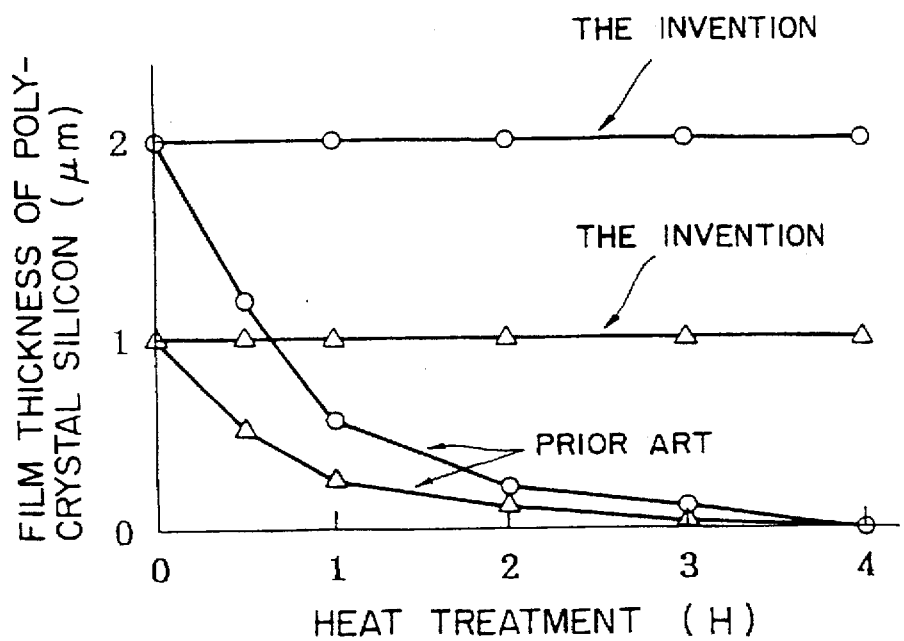
F I G. 15
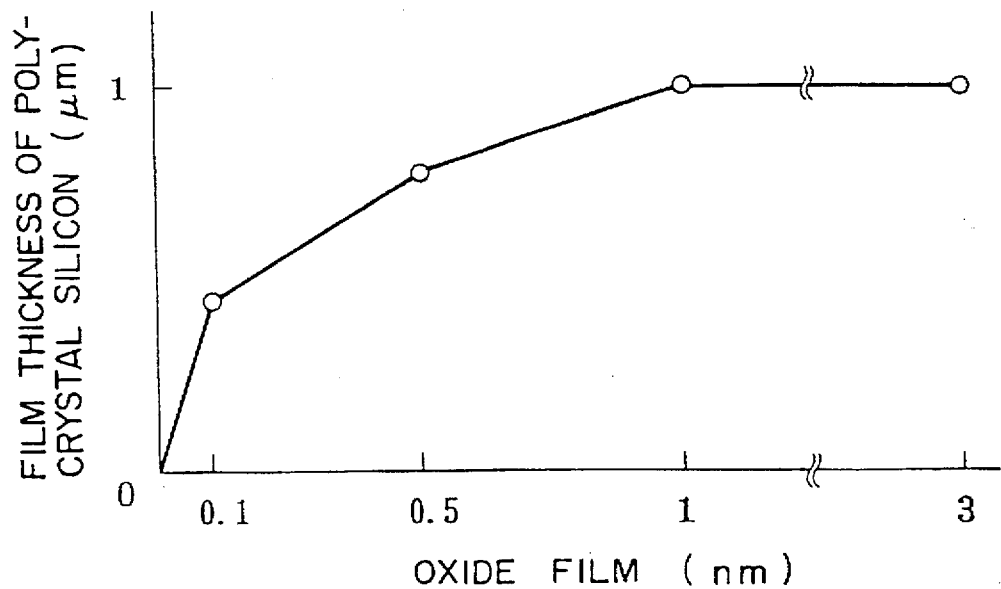
F I G. 16

SEMICONDUCTOR SILICON WAFER AND PROCESS FOR PRODUCING IT

This is a division of application Ser. No. 08/279,007 filed on Jul. 22, 1994, now U.S. Pat. No. 5,534,294.

BACKGROUND OF THE INVENTION

1. Field of the Invention

The present invention relates to a process for producing a semiconductor silicon wafer. Particularly, the present invention relates to a semiconductor silicon wafer having not only a high gettering ability but also a denuded zone on the top side (surface) thereof, and to a process for producing it.

2. Related Background Art

Semiconductor silicon wafers are obtained by slicing a silicon ingot into wafers, and then various heat treatments are effected on the thus obtained semiconductor silicon wafers in the device processes.

A variety of gettering techniques are used to let metal contaminations, which were introduced into a semiconductor silicon wafer in the device processes, be captured in a region other than an element active region. The gettering techniques are classified into two large groups.

One of them is an intrinsic gettering (hereinafter referred to as "IG") process as shown in FIG. 12A, which utilizes precipitates of oxygen contained in the semiconductor silicon wafer in an amount of about $1 \times 10^{18}$ $(cm^{-3})$ as formed in the heat treatments. With heat treatments at a high temperature, at a low temperature and at a medium temperature in this order, outward diffusion of surface oxygen in semiconductor silicon wafer, nucleus formation for precipitates of oxygen and growth of oxygen precipitates occur, whereby the oxygen precipitates are formed only inside the semiconductor silicon wafer. An IG semiconductor silicon wafer is thus obtained with an element active region on the top side being a denuded zone. Although IG is generally known to have a higher gettering ability as compared with extrinsic gettering (hereinafter referred to as "EG") described below, it is extremely difficult to make the denuded zone on the top side completely free from faults.

The most generally used EG is a sand-blasting method, in which fine scars having a size of about 1 μm or less are formed by bombarding the back side of the semiconductor silicon wafer with fine silicon particles. Then, the semiconductor silicon wafer thus obtained is oxidized to cause oxidation-induced stacking faults (OSF) or dislocation from the scars, so that the back side of the semiconductor silicon wafer becomes metal gettering sites (FIG. 12B). However, silicon (Si) could be peeled off in a scar portion so as to produce fine dust.

A recent method drawing attention as EG with high gettering ability is a process for producing a semiconductor silicon wafer having polycrystal silicon on the back side. This is a process in which polycrystal silicon is deposited by the vapor growth method (CVD) on the back side of a silicon wafer sliced off from a silicon ingot in the form of a wafer. According to this process, oxygen precipitates can be induced by the gettering effect in the polycrystal grain boundaries and by the heat treatments in the device processes, whereby both effects of EG and IG can be expected (FIG. 12C).

Incidentally, CMOS heat treatment simulation was conducted to measure the density of produced oxygen precipitates along the cross section of semiconductor silicon wafer, using two types of semiconductor silicon wafers made of silicon wafers of oxygen content $[Oi]=13 \times 10^{17}$ $(cm^{-3})$ sliced off from a same ingot. One of them was produced by depositing polycrystal silicon on the back side of silicon wafer, while the other by EG in the sand-blasting method. The measurement results are shown in FIG. 13. As shown in FIG. 13, the semiconductor silicon wafer with back side polycrystal silicon has the density of oxygen precipitates about 2-order higher than that of the sand-blasting semiconductor silicon wafer, so that greater IG effect can be expected. On the other hand, the silicon wafer having back side polycrystal silicon shows, however, that the density of oxygen precipitates is higher in the vicinity of the top side. Such oxygen precipitates in the vicinity of the top side become recombination centers of carriers, which in turn cause degradation of device characteristics, or crystal defects.

Further, when the silicon wafer is subjected to a heat treatment at a high temperature in a reducing atmosphere for forming a denuded zone on the top side, employing the conventional extrinsic gettering method for forming a polycrystal silicon film on the back side of a silicon wafer, the back side polycrystal silicon film is recrystallized, whereby the thickness of the polycrystal silicon film might be considerably reduced so as to considerably lower the gettering ability.

Furthermore, various types of heat treatments at high temperature are performed in actual manufacturing steps of semiconductor devices, whereby the recrystallization of the polycrystal silicon film also occurs so as to lower the gettering ability.

SUMMARY OF THE INVENTION

The present invention has been accomplished under the above circumstances. An object of the present invention is to provide a semiconductor silicon wafer which has a high gettering ability, which can form a denuded zone on the top side and which can fully suppress a decrease of polycrystal silicon film during heat treatments at high temperature, and further to provide a process for producing it.

The present invention provides, as in claim 1, a process for producing a semiconductor silicon wafer, comprising a step of forming a polycrystal silicon depositing film on one side of a silicon wafer and a subsequent step of subjecting the silicon wafer to a heat treatment in an inert gas, a reducing gas or a mixture thereof.

Further, the present invention provides, as in claim 3, a process for producing a semiconductor silicon wafer, comprising a step of subjecting a silicon wafer to a heat treatment in an inert gas, a reducing gas or a mixture thereof, and a subsequent step of forming a polycrystal silicon depositing film on one side of the silicon wafer.

Furthermore, the present invention provides, as in claim 7, a process for producing a semiconductor silicon wafer, comprising a step of forming an oxide film having the thickness in the range of about 1 nm–3 nm on one side of a silicon wafer, a step of forming a polycrystal silicon depositing film on the oxide film thus formed and a step of subjecting the silicon wafer to a heat treatment in an inert gas, a reducing gas or a mixture thereof.

In the above process for producing the semiconductor silicon wafer, it is desired that the polycrystal silicon film is doped with at least one of boron, arsenide or phosphorus.

Further, it is preferred that the above heat treatment is performed at a temperature of at least 1100° C. for 10 minutes and that the thickness of the polycrystal silicon film remains in the range of about 0.5 μm–2.5 μm after the above heat treatment.

Yet furthermore, the present invention provides, as in claim 12, a semiconductor silicon wafer having an oxide film formed in the thickness of about 1 nm–3 nm on one side of the silicon wafer and a polycrystal silicon depositing film formed on the surface of the oxide film.

In the above semiconductor silicon wafer, the thickness of the polycrystal silicon depositing film is preferably about 0.5 µm–2.5 µm.

The process for producing a semiconductor silicon wafer, as in claim 1 or 3, includes forming a polycrystal silicon depositing film on one side of silicon wafer and discharging oxygen from the other side, so that oxygen precipitates are produced by the heat treatments in the device processes, whereby the gettering effect can be improved and a denuded zone can be formed on the other side.

According to the present invention as in claim 7 or 12, a polycrystal silicon film is deposited on the back side of the silicon wafer after an oxide film is formed in the thickness of 1 nm–3 nm on the back side of the silicon wafer, and the recrystallization of the polycrystal silicon can be suppressed by the oxide film in the subsequent heat treatments. Accordingly, a high gettering ability can be maintained throughout the semiconductor fabricating processes.

BRIEF DESCRIPTION OF THE DRAWINGS

FIG. 10 is a flow chart to show another modification with correspondence to FIG. 9;

FIG. 15 is a graph to show a ratio of decrease in film thickness of polycrystal silicon film relative to heat treatment time, in which the abscissa indicates the heat treatment time and the ordinate the film thickness of polycrystal silicon film;

FIG. 16 is a graph of experimental results to show a relation between a decrease in polycrystal silicon film thickness and an oxide film thickness formed on the back side of semiconductor silicon wafer after a heat treatment, in which the abscissa indicates the oxide film thickness and the ordinate the polycrystal silicon film thickness;

DESCRIPTION OF THE PREFERRED EMBODIMENTS

First Embodiment

Figures 1A, 1B:
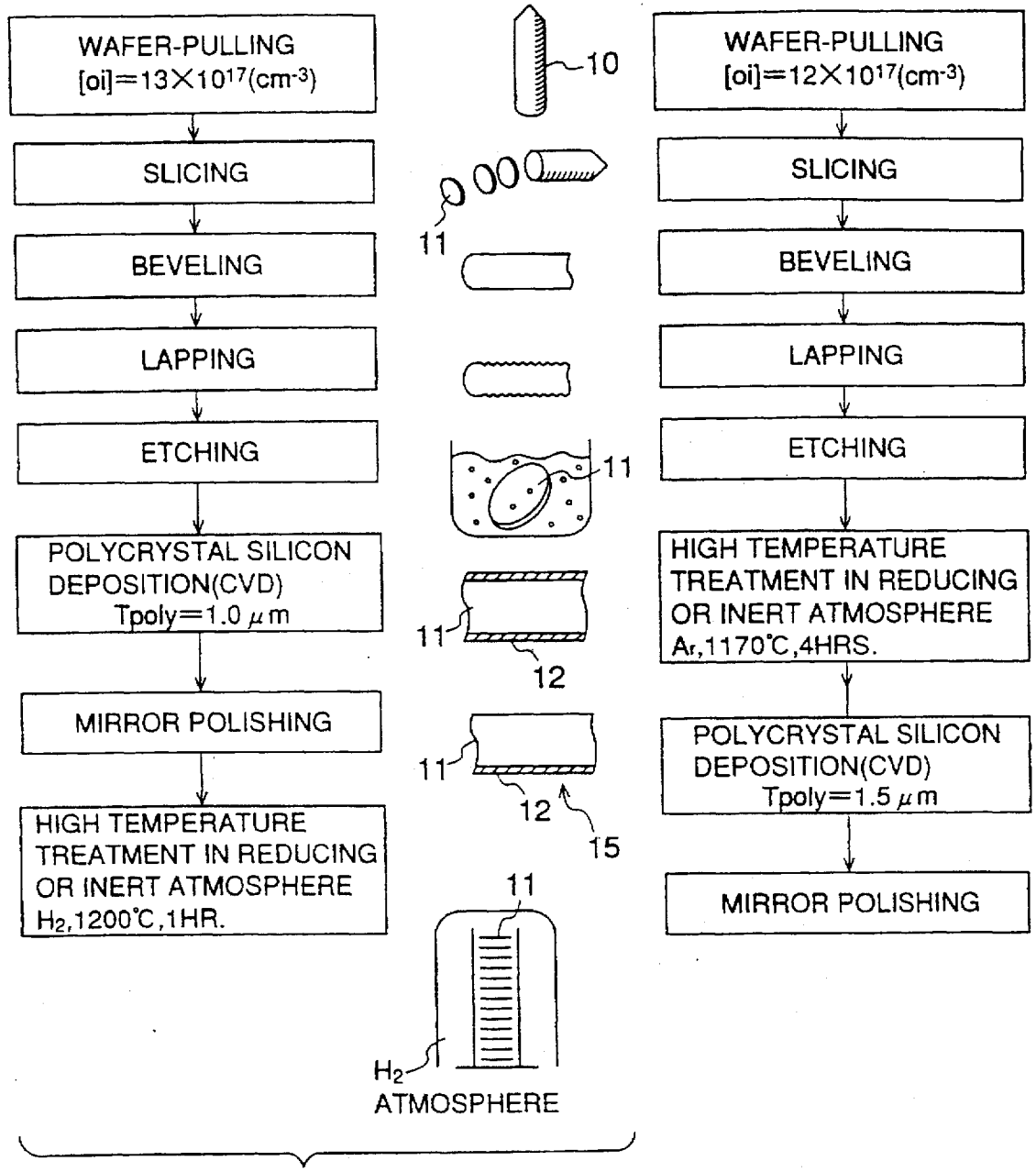
FIGS. 1A and 1B are flow charts to show a process for producing a semiconductor silicon wafer in the first embodiment of the present invention.

Now, embodiments of the present invention will be described with reference to the accompanying drawings. FIGS. 1A to 8 are drawings to show the first embodiment of the process for producing semiconductor silicon wafers according to the present invention. First, FIG. 1A shows a flow chart of the process according to the first embodiment of the present invention. As shown in FIG. 1A, a silicon ingot 10 is formed by the Cz method (pulling method) so that it has $[Oi]=13\times10^{17}$ $(cm^{-3})$.

The silicon ingot 10 is cut into wafers to obtain silicon wafers 11 (slicing). Then, the edges of each silicon wafer 11 are made round (beveling) and the silicon wafer 11 is subjected to lapping to make its thickness close to the standard thickness, followed by etching to remove crushed layers by the lapping.

Next, a polycrystal silicon film 12 is deposited in the thickness of 1 µm on the top and back sides of silicon wafer 11 by the CVD method. Then, only the top side is subjected to mirror polishing so as to remove the polycrystal silicon film 12 from the top side. Finally, oxygen in the vicinity of the top side is discharged to the outside by a heat treatment at 1200° C. for 1 hour in a $H_2$ atmosphere.

Figure 2:
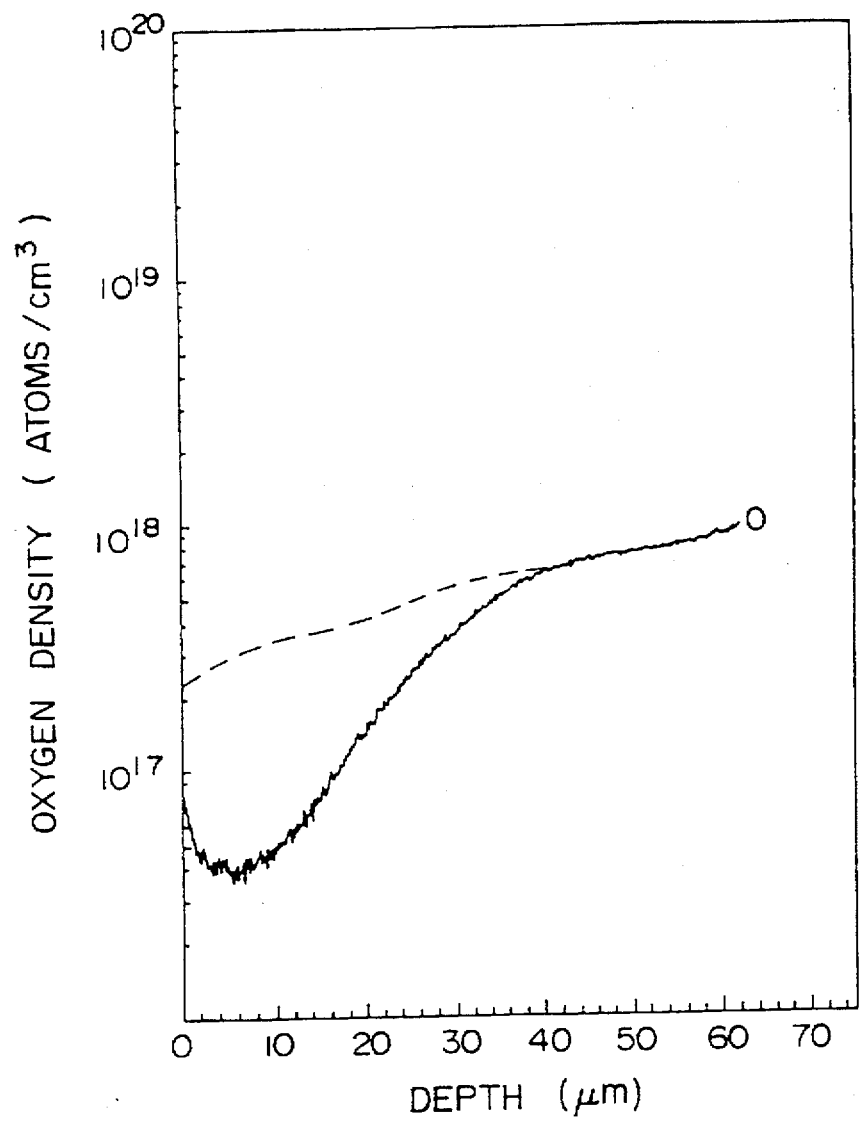
FIG. 2 is a drawing to show an oxygen concentration distribution in a semiconductor silicon wafer obtained by the first embodiment of the present invention.
Figure 3:
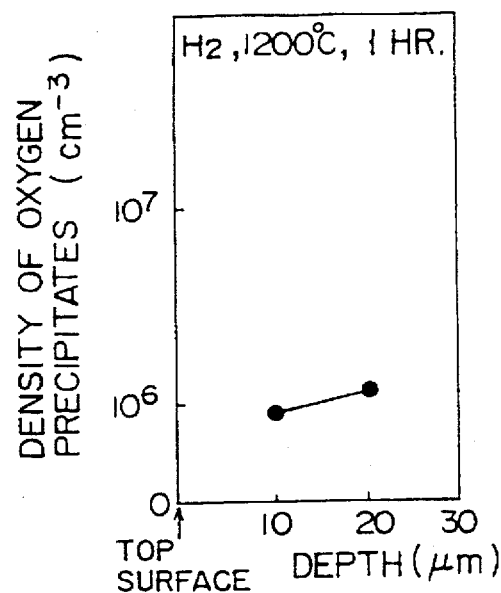
FIG. 3 is a drawing to show a density change of oxygen precipitates after the CMOS heat treatments of a semiconductor silicon wafer produced in a $H_2$ atmosphere.
Figure 13:
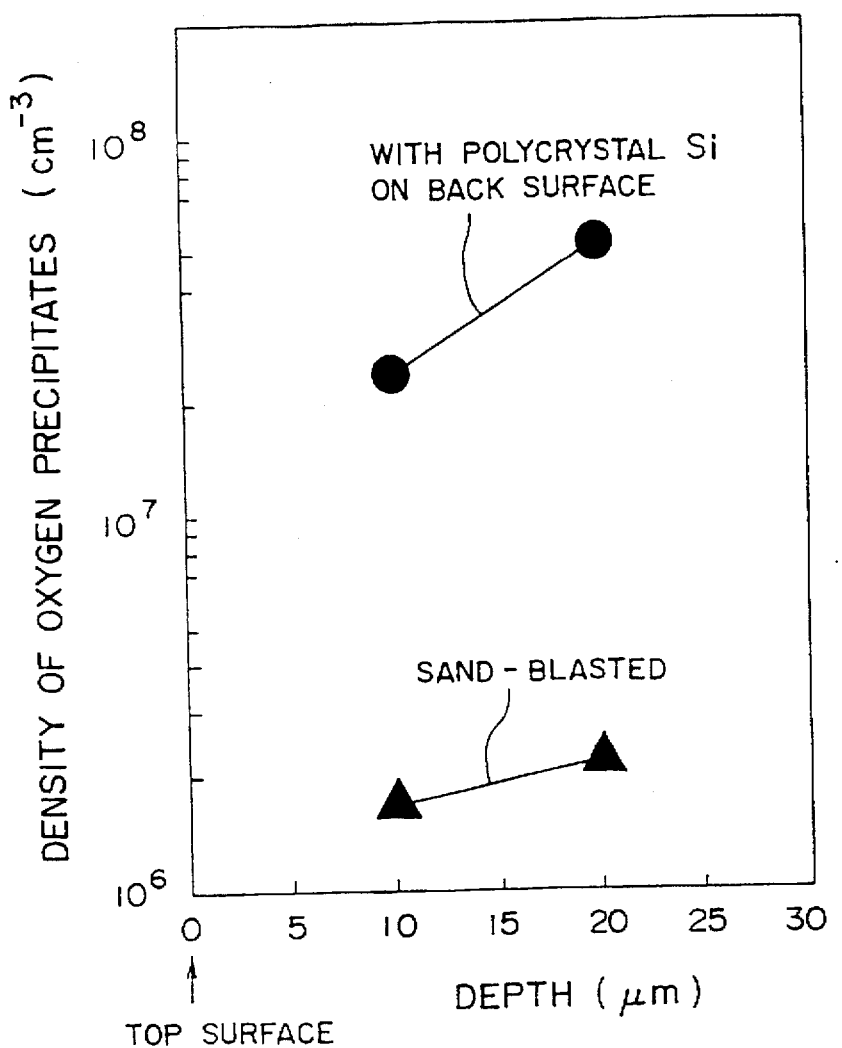
FIG. 13 is a drawing to show concentration changes of oxygen precipitates in conventional semiconductor silicon wafers.

FIG. 2 shows an oxygen concentration distribution in the vicinity of the top side along the thickness of a semiconductor silicon wafer 15 thus obtained. As shown in FIG. 2, the oxygen concentration in the vicinity of the top side (0–20 µm) is extremely reduced by the heat treatment in the $H_2$ reducing atmosphere, whereby a denuded zone can be formed near the top side of the semiconductor silicon wafer 15. In FIG. 2, the oxygen concentration after the heat treatment is shown by a solid line and the oxygen concentration before the heat treatment by a dashed line. Measurement was conducted such that the semiconductor silicon wafer 15 was subjected to the CMOS heating treatments and that oxygen precipitates formed on the top side were measured. The results thus obtained are shown in FIG. 3. It is evident from a comparison between FIGS. 3 and 13 that a denuded zone can be provided on the top side by using the process of the present embodiment.

Another embodiment of the present invention is shown in FIG. 1B. As shown in FIG. 1B, a silicon wafer 11 is subjected to a heat treatment to outwardly discharge oxygen from the vicinity of the top and back sides of silicon wafer 11. Then, polycrystal silicon 12 is deposited in the thickness of 1.5 µm on the top and back sides of silicon wafer 11 by the CVD method, and only the top side is mirror-polished.

Figure 4:
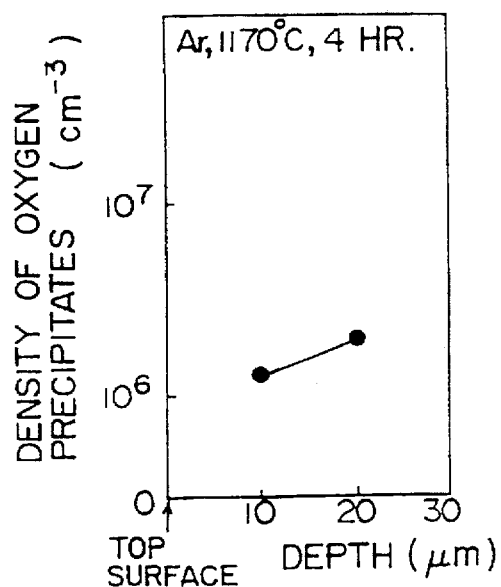
FIG. 4 is a drawing to show a density change of oxygen precipitates after the CMOS heat treatments in a semiconductor silicon wafer produced in an Ar atmosphere.

In this case, the heat treatment is conducted at 1170° C. for 4 hours in an Ar inert gas atmosphere. Measurement was conducted such that the semiconductor silicon wafer thus obtained was subjected to the CMOS heat treatments and that oxygen precipitates formed on the top side were measured. The measurement results are shown in FIG. 4.

Figure 5:
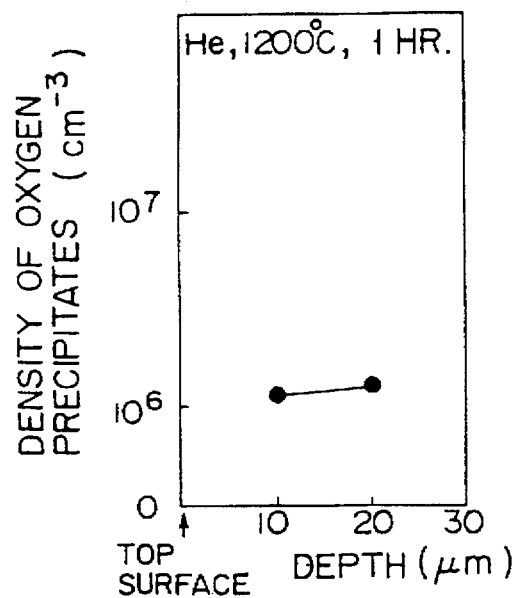
FIG. 5 is a drawing to show a density change of oxygen precipitates after the CMOS heat treatments in a semiconductor silicon wafer produced in a He atmosphere.
Figure 6:
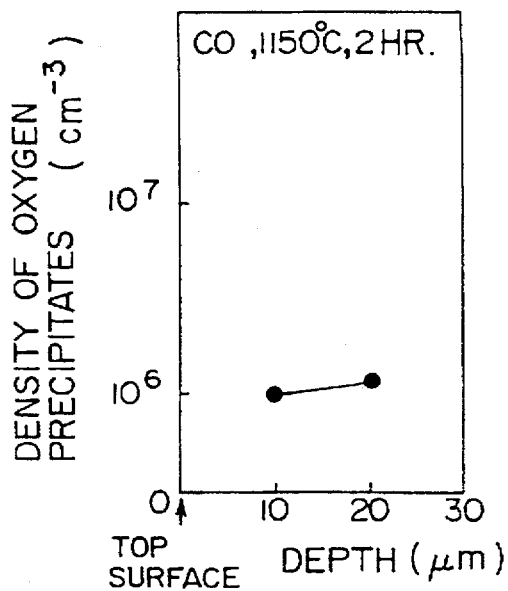
FIG. 6 is a drawing to show a density change of oxygen precipitates after the CMOS heat treatments in a semiconductor silicon wafer produced in a CO atmosphere.

The process as shown in FIG. 1A may be modified such that after depositing the polycrystal silicon 12, the heat treatment is performed at 1200° C. for 2 hours in a He atmosphere instead of that in the $H_2$ atmosphere. Further, replacing the $H_2$ atmosphere, the heat treatment may be conducted in a CO atmosphere at 1150° C. for 30 minutes. Measurement was conducted such that semiconductor silicon wafers 15 obtained by the above heat treatments were subjected to the CMOS heat treatments and that top side oxygen precipitates were measured. The measurement results are shown in FIGS. 5 and 6.

The above processes showed examples in which the heat treatment was performed in the reducing atmosphere or in the inert atmosphere to discharge oxygen from the silicon wafer 11. In addition, the heat treatment may be performed in an atmosphere of a mixture of a reducing gas and an inert gas.

Then, the CMOS heat treatments were performed for four types of semiconductor silicon wafers, i.e., a semiconductor silicon wafer obtained by the present invention, a conventional semiconductor silicon wafer having polycrystal silicon, a conventional semiconductor silicon wafer subjected to a heat treatment at a high temperature in a reducing atmosphere (1200° C., $H_2$, 1 hour) and a conventional semiconductor silicon wafer subjected to the sand-blasting treatment, and a distribution of the density of oxygen precipitates in the thickness direction was measured. The four types of semiconductor silicon wafers had substrate oxygen concentration of $13 \times 10^{17}$ ($cm^{-3}$). The results are shown in FIG. 8.

Figure 8:
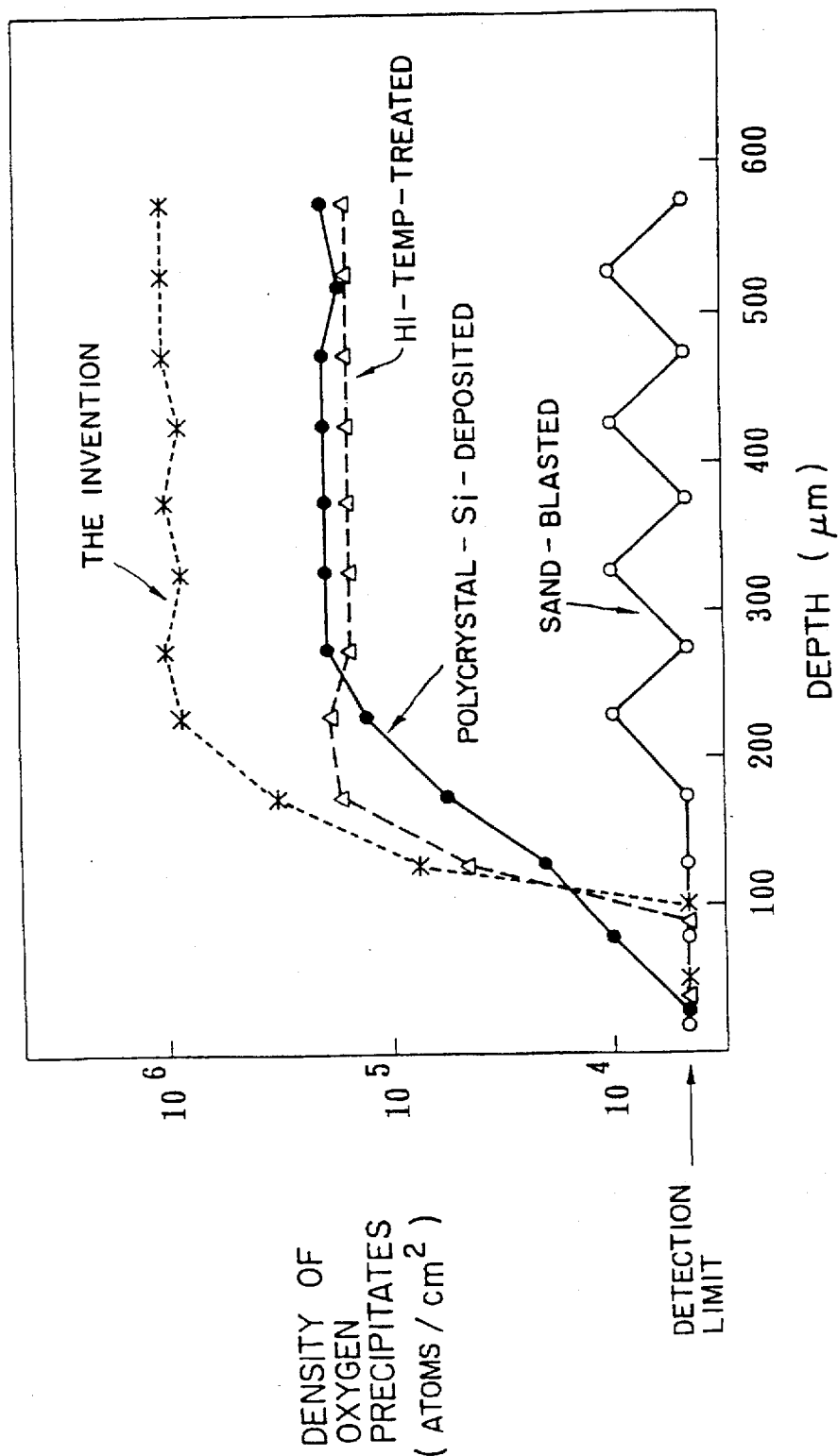
FIG. 8 is a drawing to show a concentration change of oxygen precipitates in a semiconductor silicon wafer obtained by the present invention.

As shown in FIG. 8, few oxygen precipitates are formed in the semiconductor silicon wafer which was subjected to the sand-blasting treatment, because of the low substrate oxygen concentration. Inside the semiconductor silicon wafer having polycrystal silicon which shows a property to induce oxygen precipitates by a heat treatment and the semiconductor silicon wafer subjected to the high-temperature heat treatment in the reducing atmosphere, oxygen precipitates are formed in an amount 2-order higher as compared with the semiconductor silicon wafer subjected to the sand-blasting treatment. In contrast, according to the present invention, oxygen precipitates are formed in an amount about one-order higher than that of the semiconductor having the polycrystal silicon and that of the semiconductor silicon wafer subjected to the high heat treatment in the reducing atmosphere, thus showing that the semiconductor silicon wafer of the present invention has a higher gettering ability.

Figure 7:
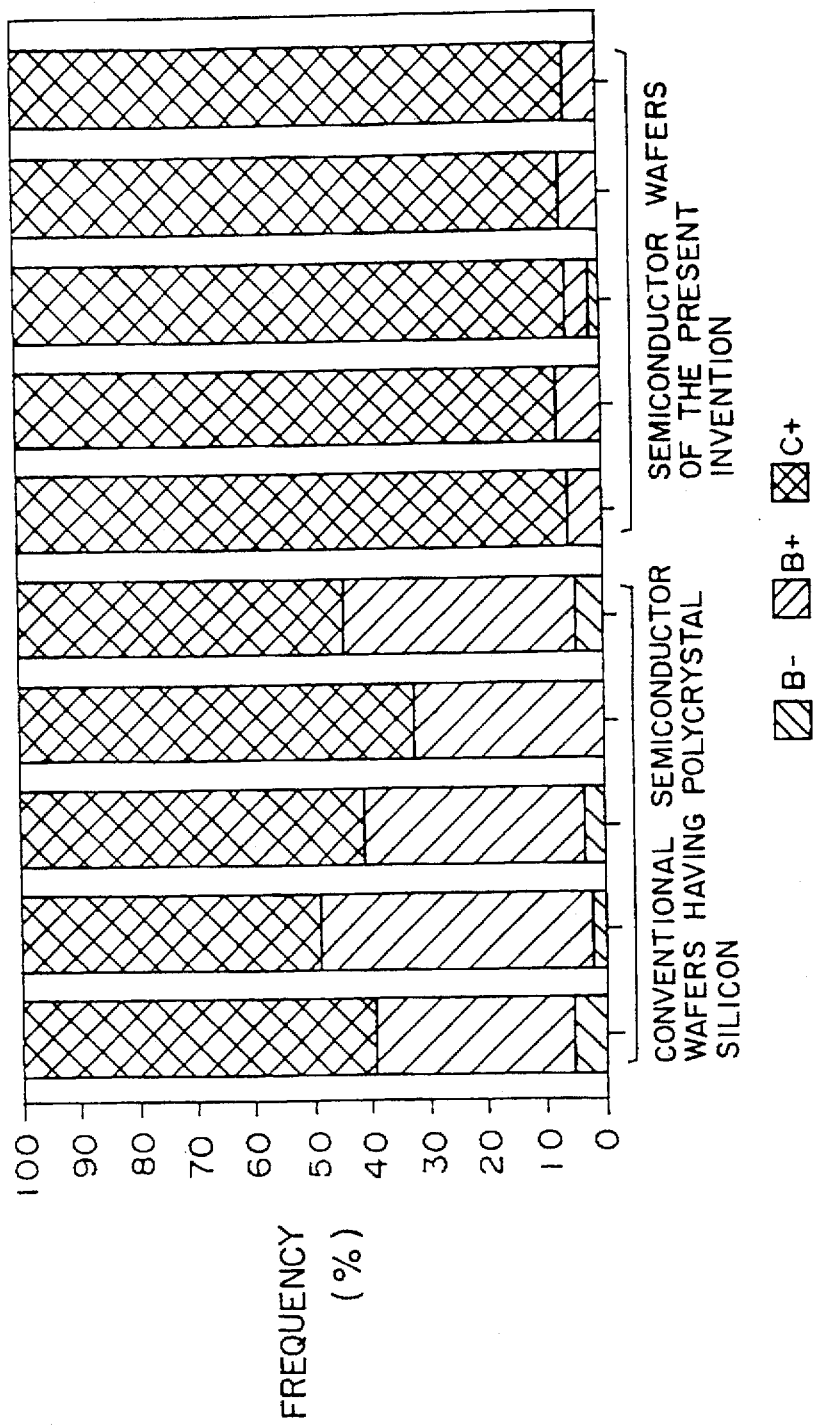
FIG. 7 is a drawing to show measurement results of oxide withstand voltage tests for semiconductor silicon wafers obtained by the present invention.

Five semiconductor silicon wafers obtained by the process as shown in FIG. 1A and five conventional semiconductor silicon wafers having polycrystal silicon were used to measure a withstand voltage of oxide film. The measurement conditions were such that the oxide film thickness was 30 nm and the capacitor area was 10 $mm^2$. The measurement results are shown in FIG. 7. As shown in FIG. 7, the semiconductor silicon wafers of the present invention have withstand-voltage-acceptable percentages (C+) higher than those of the conventional semiconductor silicon wafers having polycrystal silicon, verifying superiority of the present invention. FIG. 7 is a drawing to show frequencies for withstand-voltage-acceptable percentage (C+), withstand-voltage-defective percentage (B−) and intermediate percentage (B+).

Next described are modifications of the first embodiment of the present invention.

Figure 9:
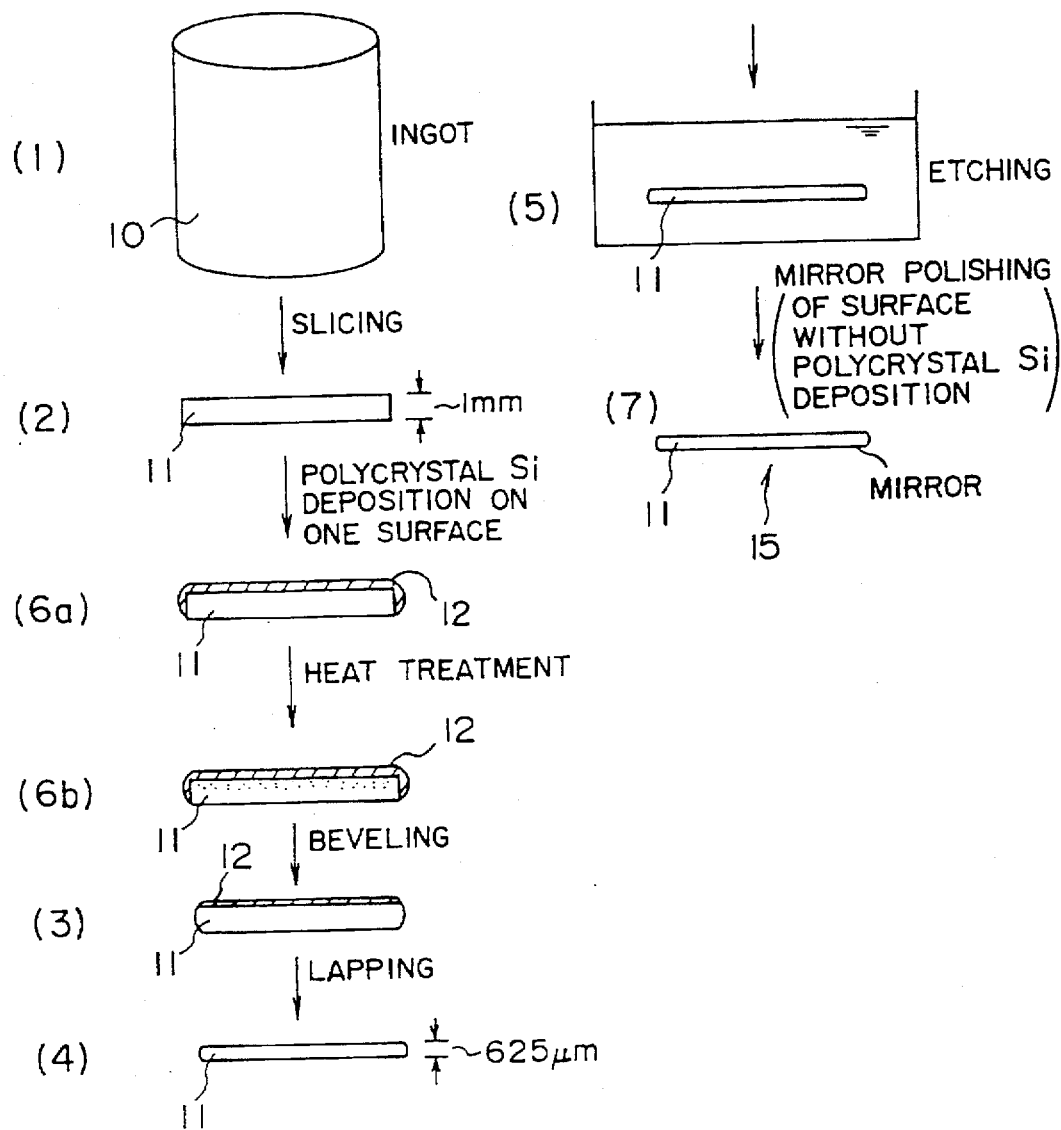
FIG. 9 is a flow chart to show a modification of the first embodiment according to the present invention.

FIGS. 9 and 10 are drawings to show the modifications of the first embodiment of the present invention. For comparison, a conventionally well-known process for producing semiconductor silicon wafers is shown in FIG. 11.

Figure 11:
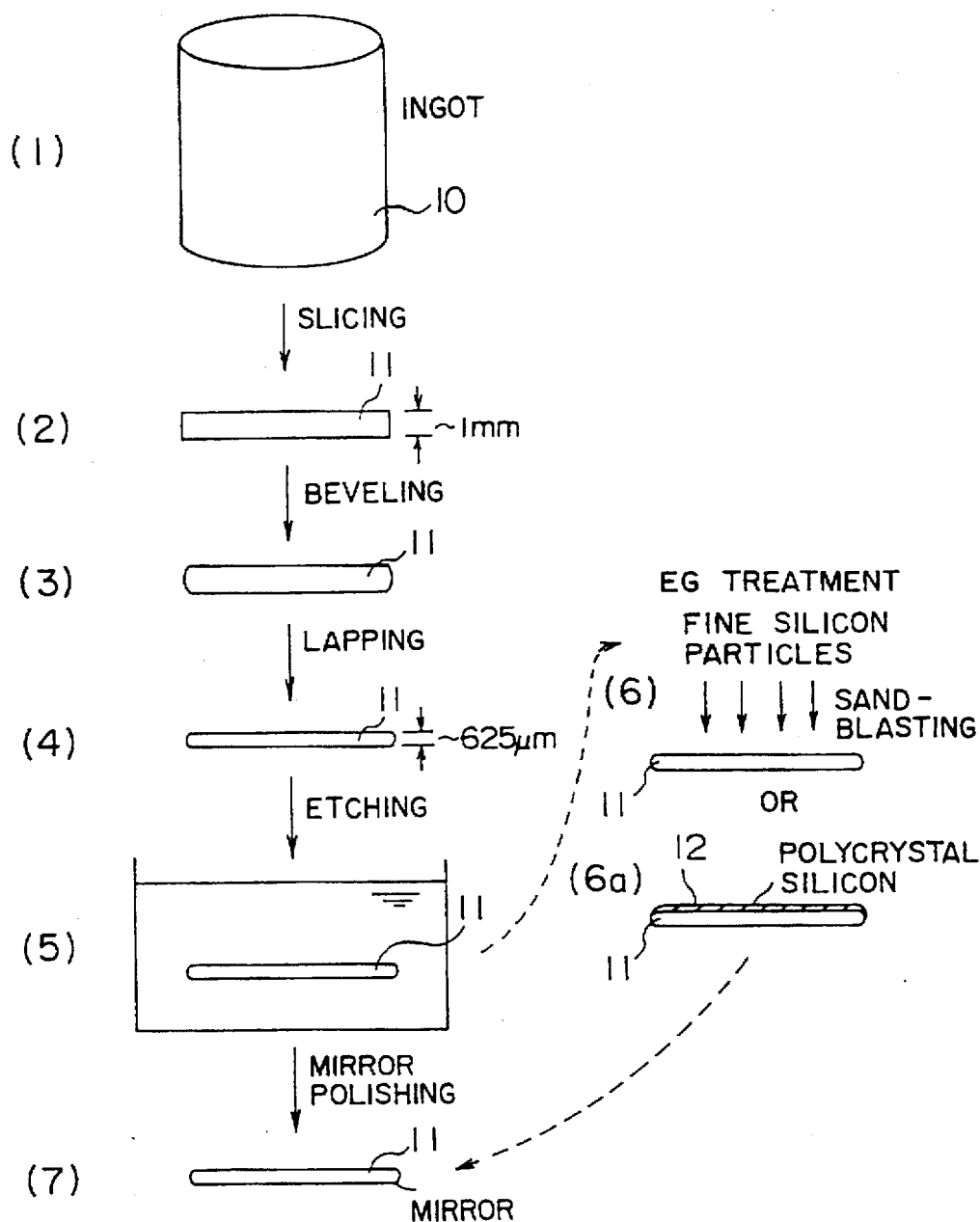
FIG. 11 is a flow chart to show a conventional manufacturing process for comparison.
Figure 12A:
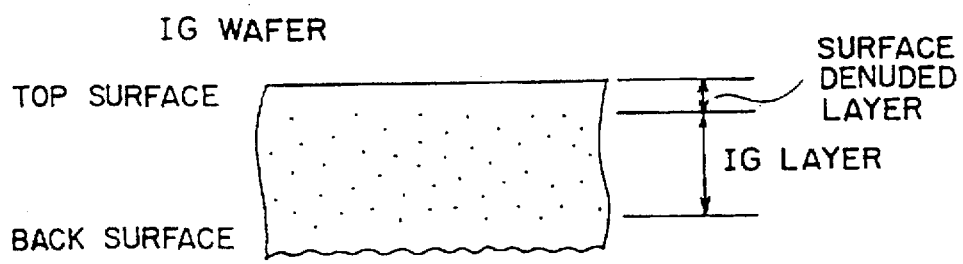
FIGS. 12A, 12B and 12C are drawings to show conventional semiconductor silicon wafers.
Figure 12B:
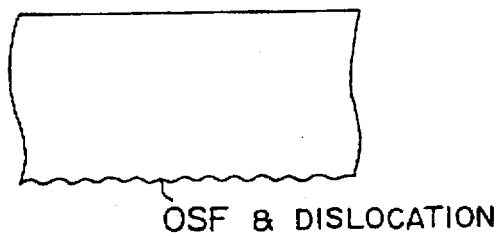
Figure 12C:
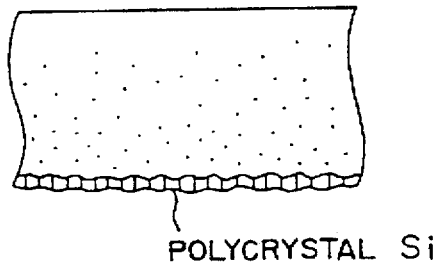

As shown in FIG. 11, (1) a silicon ingot 10 is formed by the Cz method (pulling method). (2) The silicon ingot 10 is sliced to obtain silicon wafers 11. The slicing thickness is about 1 mm. (3) The edges of each wafer are made round (bevel formation). (4) The thickness of the silicon wafer 11 is made as close as the standard thickness (625 μm) by lapping. (5) Crashed layers by the lapping are removed by etching and (7) mirror-polishing is finally performed for finishing only on one side (top side).

In the above steps, a donor killer heat treatment is performed at 650° C. after (4) the lapping step or (5) the etching step in order to eliminate thermal donors due to oxygen. In addition, in case of the EG treatment being performed, (6) a sand-blasting treatment or (6a) a polycrystal silicon depositing treatment is conducted after the etching step (5), followed by (7) the last step of mirror-polishing for finishing.

Now, a manufacturing process of the present invention is described with reference to FIG. 9. As shown in FIG. 9, (1) a silicon ingot 10 is formed by the Cz method, and then (2) the silicon ingot 10 is sliced into wafers to obtain silicon wafers 11. The slicing thickness of silicon wafers 11 is about 1 mm.

Then, (6a) a polycrystal silicon depositing film 12 is formed on one side of silicon wafer 11 in the thickness of 1 μm by the CVD method. The polycrystal silicon depositing treatment is conducted in the temperature range of from 620° C. to 650° C., so that thermal donors in the silicon wafer 11 are annihilated during this depositing treatment, which obviates a separate donor killer treatment.

Then, (6b) oxygen precipitates are preliminarily formed in the polycrystal silicon depositing film by a heat treatment at 1000° C. for 10 hours.

Subsequently conducted as in the conventional steps are (3) beveling of silicon wafer edges (beveling formation) and (4) adjustment of thickness of the silicon wafer 11 by lapping. As described, the polycrystal silicon depositing film 12 formed on one side of the silicon wafer 11 is removed to make the thickness of the silicon wafer be 625 μm.

Then, (5) crushed layers produced by the lapping are removed and (7) mirror-polishing is performed for finishing, whereby a semiconductor silicon wafer 15 is obtained.

Another modification of the first embodiment of the present invention is described with reference to FIG. 10. A manufacturing process as shown in FIG. 10 is the same as that shown in FIG. 9 except that (6a) a polycrystal silicon depositing film is formed on one side of silicon wafer 11 after (2) the step of slicing the silicon ingot 10 and (3) the step of beveling formation.

In this process in FIG. 10, (6a) the polycrystal silicon depositing treatment is conducted at 630° C. and the thickness of the depositing film is 0.8 μm. Further, the heat treatment for preliminarily forming oxygen precipitates in the polycrystal silicon depositing film 12 is conducted at 950° C. for 8 hours.

It was confirmed that the semiconductor silicon wafers produced by the process as shown in FIG. 10 were equivalent in characteristics to the semiconductor silicon wafers obtained by the process as shown in FIG. 9.

Second Embodiment

The second embodiment of the present invention will be described below with reference to FIGS. 14 to 18.

Figure 14:
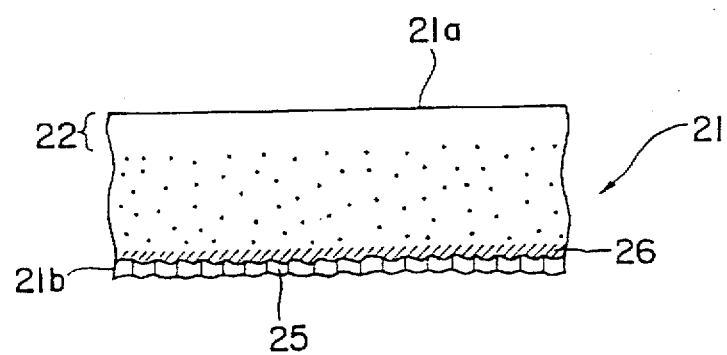
FIG. 14 is a drawing to show a schematic cross section of a semiconductor silicon wafer in the second embodiment according to the present invention.

A semiconductor silicon wafer 21 as shown in FIG. 14 has an oxygen content of about $13 \times 10^{17}$ ($cm^{-3}$), which is used in the present embodiment. The silicon wafer 21 is treated with a chemical to form an oxide film 26. This chemical treatment is performed at 70° C. for 20 minutes using a chemical SH ($H_2O_2/H_2SO_4$), to form the oxide film 26 in the thickness of 2 nm. Here, the thickness 2 nm of oxide film 26 is measured by XPS (X-ray photoelectron spectroscopy). As the chemical, diluted HF ($HF:H_2O$), SC2 ($H_2O_2/HCl/H_2O$), NC2 (choline/$H_2O_2/H_2O$) may be used instead of SH as used above.

After the chemical treatment, an undoped polycrystal silicon film 25 is deposited in the thickness of 1 μm–2 μm by the vapor growth (CVD) method on the back side 21b of the silicon wafer 21 having the oxide film 26 formed thereon.

After the deposition of the polycrystal silicon film 25, the silicon wafer 21 is subjected to a high-temperature heat treatment at a temperature of at least 1100° C. for 10 minutes in an atmosphere of hydrogen as the reducing gas. In this high-temperature heat treatment, an inert gas such as Ar, He, Xe, Kr, Ne, etc., or a mixture of an inert gas as listed and a reducing gas may be used instead of the reducing gas.

The silicon wafer 21 thus obtained has a surface denuded zone 22 formed on the top side 21a by the extrinsic gettering effect in the polycrystal grain boundaries of the polycrystal silicon layer 25 deposited on the silicon wafer back side 21b and by the intrinsic gettering effect in the high-temperature heat treatment. Further, the polycrystal silicon film 25 can maintain a sufficient thickness even though subjected to the subsequent high-temperature heat treatment, because recrystallization is suppressed by the existence of the oxide film 26.

Next, it is exemplified by experiments that the oxide film 26 serves to suppress recrystallization of the polycrystal silicon film 25.

Two types of semiconductor silicon wafers of the present invention and two types of conventional semiconductor silicon wafers were prepared for the experiments. The two types of semiconductor silicon wafers of the present invention were those obtained by forming an oxide film in the thickness of 2 nm by the same chemical treatment as above and by depositing a polycrystal silicon film on the oxide film by the vapor growth method in the thickness of 1 μm or 2 μm, respectively. The two types of conventional semiconductor silicon wafers were those obtained by depositing a polycrystal silicon film by the vapor growth method in the thickness of 1 μm or 2 μm, respectively, without forming an oxide film. The two types of semiconductor silicon wafers of the present invention and the two types of conventional semiconductor silicon wafers were subjected to a high-temperature heat treatment. The high-temperature heat treatment was performed in a hydrogen atmosphere at 1200° C. while a treating time was changed as 0, 0.5 hour, 1 hour, 2 hours, 3 hours and 4 hours.

The results of the experiments are shown in FIG. 15, in which the abscissa indicates the high-temperature heat treatment time and the ordinate the thickness of the polycrystal silicon film. It is clear from the graph that when the conventional semiconductor silicon wafers are subjected to the high-temperature heat treatment, the polycrystal silicon film is recrystallized to rapidly reduce its thickness. In contrast, the two types of semiconductor silicon wafers of the present invention do not change the thickness of the polycrystal silicon film even though subjected to the high-temperature heat treatment. Accordingly, it was verified that the oxide film was able to fully suppress the recrystallization of polycrystal silicon.

It is next exemplified by experiments that the optimum thickness of the oxide film 6 is in the range of about 1 nm to about 3 nm.

Four types of oxide films having the thickness of 0.1 nm, 0.5 nm, 1 nm or 3 nm were formed on four semiconductor silicon wafers using four types of chemicals, i.e., diluted HF($HF:H_2O$), SC2($H_2O_2/HCl/H_2O$), NC2(choline/$H_2O_2/H_2O$) and SH($H_2O_2/H_2SO_4$), respectively. After depositing a polycrystal silicon film in the thickness of 1 μm on each of the four types of semiconductor silicon wafers having the respective oxide films thus formed thereon, they were subjected to a high-temperature heat treatment at 1200° C. for 1 hour in a hydrogen atmosphere. The thickness of polycrystal silicon film was measured after the high-temperature heat treatment.

The experimental results are shown in FIG. 16, in which the abscissa represents the thickness of oxide film and the ordinate the thickness of polycrystal silicon film. It is clear from the graph that the recrystallization of polycrystal silicon film by the high-temperature heat treatment can be fully suppressed by setting the thickness of oxide film within the range of about 1 nm–3 nm. However, if the thickness of oxide film becomes far larger than about 3 nm, metal impurities are blocked by the oxide film to stop diffusing into the polycrystal silicon film, whereby the gettering effect is considerably reduced.

Next described is a modification of the second embodiment of the present invention.

When a polycrystal silicon film 25 is deposited on a wafer as in FIG. 14, it is doped with boron using $B_2H_6$ ($10^{19}$atms/$cm^3$). As the doping material, arsenide or phosphorus may be used instead of boron.

The depositing thickness of the polycrystal silicon film 25 is preferably so set that when a high-temperature heat treatment is performed at a temperature of at least 1100° C. for 10 or more minutes after the deposition, the polycrystal silicon film 25 remains in the thickness of 0.5 μm–2.5 μm.

It is next exemplified by experiments that surface faults can be considerably reduced in the semiconductor silicon wafers according to the present invention as compared with the conventional semiconductor silicon wafers.

P-type boron-doped semiconductor silicon wafers having oxygen of $13 \times 10^{17}$ ($cm^{-3}$) and p=2–5 (Ωcm) were prepared. In First Example A of the present invention, an oxide film was formed in the thickness of 2 nm on the back side of one of the semiconductor silicon wafers, and then a polycrystal silicon film was deposited in the thickness of 1 μm to obtain a semiconductor silicon A. In Second Example B of the present invention, after forming an oxide film on the back side of another semiconductor silicon wafer in the thickness of 2 nm, a polycrystal silicon film doped with boron ($10^{19}$ atms/$cm^3$) was deposited in the thickness of 1 μm to obtain a semiconductor silicon B. On the other hand, as Comparative Example, a polycrystal silicon film was deposited in the thickness of 1 μm without forming an oxide film on the back side of another one of the above semiconductor silicon wafers.

The two types of semiconductor silicon wafers A and B of the present invention and the conventional semiconductor silicon wafer thus obtained were subjected to a heat treatment at 1200° C. for 1 hour in a hydrogen atmosphere, and then to heat treatments equivalent to the CMOS treatments, e.g., at 1200° C. for 10 hours, at 800° C. for 3 hours and at 1000° C. for 16 hours, and thereafter an oxide film on the top side was peeled off with $NH_4F$. Then, the top side was metal-contaminated with Fe or Ni, and a high temperature heat treatment was conducted at 1000° C. for 16 hours in an oxygen atmosphere to measure faults (OSF) appearing in the top side.

Figure 17:
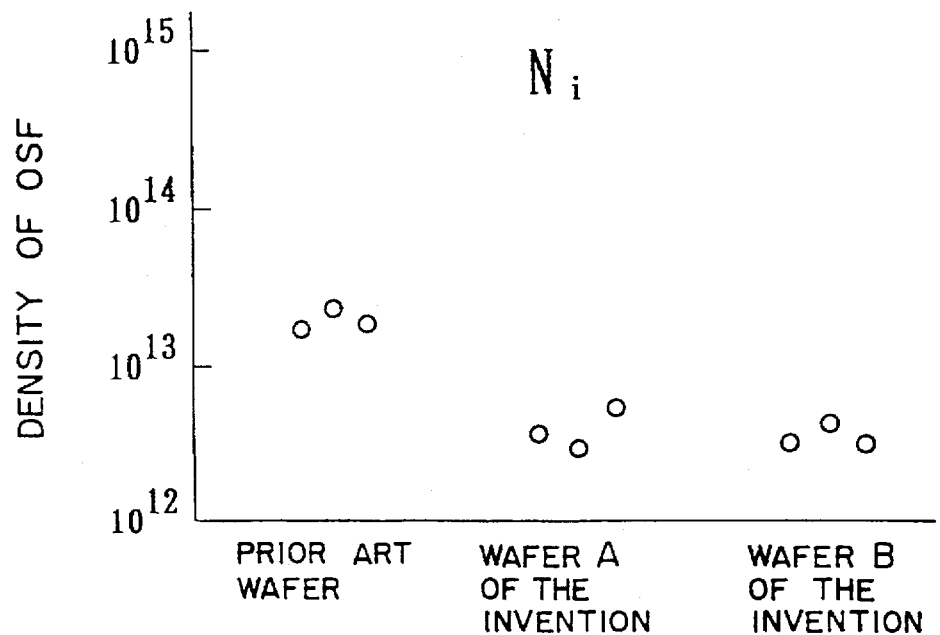
FIG. 17 is a graph of experimental results to verify that surface faults of semiconductor silicon wafer caused by Ni contaminations were reduced by the present invention.
Figure 18:
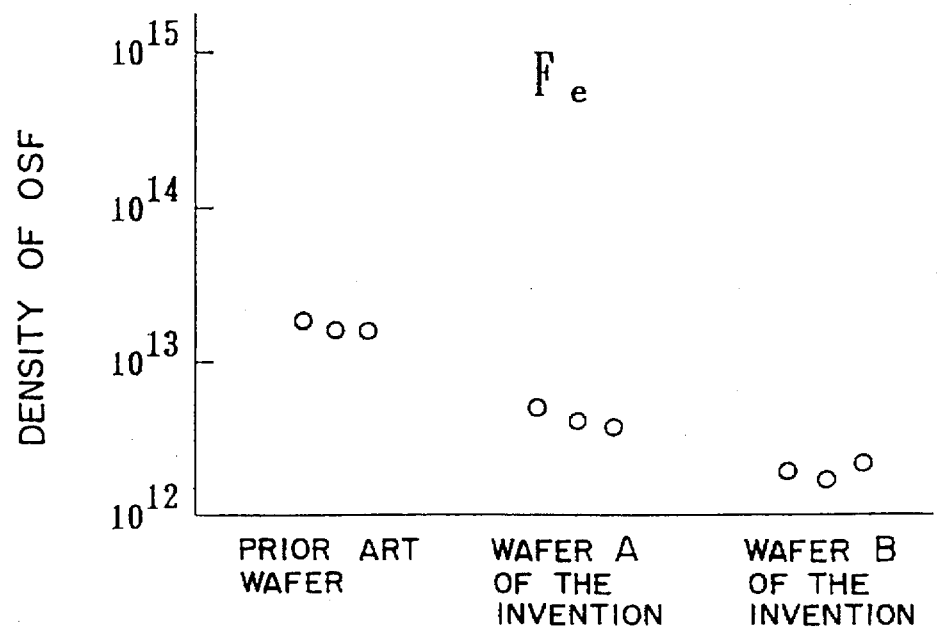
FIG. 18 is a graph of experimental results to verify that surface faults of semiconductor silicon wafer caused by Fe contaminations were reduced by the present invention.

FIGS. 17 and 18 are graphs to show the experimental results of contamination with Ni and Fe, respectively, in which the abscissa shows the two types of semiconductor silicon wafers A and B according to the present invention and the conventional semiconductor silicon wafer, and the ordinate the oxidation-induced stacking faults density (OSF) on the top side of the semiconductor silicon wafers.

As is evident from these graphs, the conventional semiconductor silicon wafer shows that the polycrystal silicon film is completely removed by the high-temperature heat treatment, the CMOS heat treatments and the peeling-off process of oxide film, so as to lose the gettering ability and produce many surface faults. In contrast, the semiconductor silicon wafers of the present invention show that the recrystallization of the polycrystal silicon film is suppressed by the existence of the oxide film formed on the back side of the silicon wafer and that the polycrystal silicon film fully remains even after the high-temperature heat treatment and the CMOS heat treatments. Therefore, the semiconductor silicon wafers of the invention hold the high gettering ability, so that the oxidation-induced stacking faults density (OSF) on the top side of the semiconductor silicon wafer is remarkably reduced.

Further, as seen from FIG. 18, the semiconductor silicon wafer B of the present invention is higher in gettering ability for Fe than the semiconductor silicon wafer A of the present invention, which assures that the boron-doping of polycrystal silicon film enhances the gettering ability for Fe.

Furthermore, 16M-DRAMs were fabricated using the semiconductor silicon wafers of the present invention as described above and the conventional semiconductor silicon wafers, and it turned out that the semiconductor silicon wafers of the present invention had a 10% improvement in $Y_{D/S}$ as compared with the conventional semiconductor silicon wafers.

As described above, according to the present invention, the intrinsic gettering effect can be improved by producing oxygen precipitates in the polycrystal silicon depositing film formed on one side of the semiconductor silicon wafer when the semiconductor silicon wafer is heat-treated in the device processes, and at the same time, the other side can be made free from faults. Thus, high-precision semiconductor devices can be obtained.

Further, according to the present invention, a polycrystal silicon film is deposited after an oxide film is formed on the back side of the semiconductor silicon wafer in the thickness of about 1 nm–3 nm, so that the recrystallization of the polycrystal silicon can be suppressed by the existence of the oxide film in a high-temperature heat treatment after the deposition. Accordingly, the high gettering ability can be maintained throughout the semiconductor fabrication processes, which can fully reduce faults appearing on the top side of the semiconductor silicon wafer due to metal contamination.

What is claimed is:

1. A semiconductor silicon wafer, comprising:

a silicon wafer;

an oxide film with a thickness of 1–3 nm formed on one side of said silicon wafer; and a polycrystalline silicon depositing film has a thickness of from 1–2 µm is formed on said oxide film.

2. The semiconductor silicon wafer of claim 1, wherein said oxide film is formed by a treatment with a chemical selected from the group consisting of $H_2O_2/H_2SO_4$, $HF/H_2O$, $H_2O_2/HCl/H_2O$, and $chlorine/H_2O/H_2O$.

3. The semiconductor silicon wafer of claim 2, wherein said process further comprising the step of:

subjecting said silicon wafer to a heat treatment in an inert gas, a reducing gas or a mixture thereof in a manner where the other side of said silicon wafer is exposed to said gases, so that oxygen is discharged from the other side whereby a denuded zone is formed on the other side.

4. The semiconductor silicon wafer of claim 2, wherein said oxide film is formed by a treatment with a chemical selected from the group consisting of $H_2O_2/H_2SO_4$, $HF/H_2O$, $H_2O_2/HCl/H_2O$, and $chlorine/H_2O_2/H_2O$.

5. The semiconductor silicon wafer of claim 3, wherein said heat treatment is performed at a temperature of at least 1100° C.

6. The semiconductor silicon wafer of claim 2, wherein said polycrystal silicon depositing film is formed by a vapor growth method.

7. The semiconductor silicon wafer of claim 3, wherein said oxide film is formed by a treatment with a chemical selected from the group consisting of $H_2O_2/H_2SO_4$, $HF/H_2O$, $H_2O_2/HCl/H_2O$, and $chlorine/H_2O_2/H_2O$.

8. The semiconductor silicon wafer of claim 3, wherein said polycrystal silicon depositing film is formed by a vapor growth method.

* * * * *